(12) United States Patent
Scouten et al.

(10) Patent No.: US 7,519,750 B2
(45) Date of Patent: Apr. 14, 2009

(54) LINEAR BURST MODE SYNCHRONIZER FOR PASSIVE OPTICAL NETWORKS

(75) Inventors: Shawn Scouten, Kanata (CA); Colin Cramm, Kanata (CA); Malcolm Stevens, North Gower (CA); Kenji Suzuki, Kanata (CA); Brian Wall, Stittsville (CA); Med Belhadj, Ottawa (CA)

(73) Assignee: Cortina Systems, Inc., Sunnyvale, CA (US)

(*) Notice: Subject to any disclaimer, the term of this patent is extended or adjusted under 35 U.S.C. 154(b) by 118 days.

(21) Appl. No.: 11/488,124

(22) Filed: Jul. 18, 2006

(65) Prior Publication Data

US 2008/0022143 A1 Jan. 24, 2008

(51) Int. Cl.
*G06F 13/00* (2006.01)
*G06F 13/42* (2006.01)
*G06F 12/00* (2006.01)
*H03L 7/06* (2006.01)
*H03K 5/01* (2006.01)

(52) U.S. Cl. .................. 710/100; 713/400; 710/240; 327/156; 327/165

(58) Field of Classification Search ............ 710/240, 710/241, 100; 327/156, 165; 713/400
See application file for complete search history.

(56) References Cited

U.S. PATENT DOCUMENTS

| 5,515,056 | A * | 5/1996 | Henderson et al. | 342/125 |
| 7,165,112 | B2 * | 1/2007 | Battin et al. | 709/230 |
| 7,269,144 | B2 * | 9/2007 | Gardenfors et al. | 370/280 |
| 7,305,048 | B2 * | 12/2007 | Hwang et al. | 375/316 |
| 7,305,575 | B2 * | 12/2007 | Vereen et al. | 713/500 |
| 2003/0219090 | A1 * | 11/2003 | Baba | 375/376 |
| 2004/0114702 | A1 * | 6/2004 | Friedman et al. | 375/373 |
| 2005/0073369 | A1 * | 4/2005 | Balboni et al. | 331/16 |
| 2006/0133809 | A1 * | 6/2006 | Chow et al. | 398/66 |
| 2006/0274875 | A1 * | 12/2006 | Vereen et al. | 375/371 |

OTHER PUBLICATIONS

T.C. Banwell, and N.K. Cheung, Bit-Rate Detection Circuit for Rapidly Reconfigurable Rate-Transparent Optical Networks, IEEE Photonics Technology Letters, vol. 11, No. 11, Nov. 1999.*

* cited by examiner

*Primary Examiner*—Khanh Dang
*Assistant Examiner*—Christopher A Daley
(74) *Attorney, Agent, or Firm*—The Nath Law Group; Derek Richmond; Stanley N. Portigal

(57) ABSTRACT

The present invention discloses a host receiver synchronizer for passive optical networks, and in particular a burst clock data recovery circuit in a host receiver in a bursty asynchronous communication system having a non-data preamble of less than 250 ns, for recovering a clock signal from a subscriber data burst. The circuit comprises: an adjustable oscillator for generating an output clock signal in response to a signal at an input thereof; a first comparator for comparing a frequency and phase of the output clock signal to that of a reference signal and feeding back a first feedback signal to the oscillator input; and a second comparator for comparing the frequency and phase of the output clock signal to that of the data burst and feeding back a second feedback signal to the oscillator input once the output clock signal is locked in frequency with the reference signal. The output clock signal is locked in frequency and phase to the data burst before receipt of the last bit of the preamble. The present invention is advantageous in that the receiver circuit improves synchronized jitter performance over the prior art solutions so that additional timing margin is provided, thereby allowing longer fiber lengths to be supported.

41 Claims, 2 Drawing Sheets

LINEAR BURST MODE SYNCHRONIZER FOR PASSIVE OPTICAL NETWORKS

BACKGROUND OF THE INVENTION

1. Field of the Invention

The present invention relates to passive optical networks and in particular to a novel host receiver synchronizer for passive optical networks.

2. Description of the Prior Art

Passive optical networks (PONs) are optical networks in which there is a shared host transceiver and a plurality of subscriber nodes. Each of the subscriber nodes are connected to the host transceiver by a single shared optical fiber through optical splitters.

Transmission in the downstream direction, that is, from the host transmitter to each subscriber node is accomplished by broadcasting a signal on a designated wavelength from the host transmitter through a series of optical splitters to each of the subscriber nodes. The data stream in the downstream direction contains messages which may be intended for any of the subscribers and each subscriber reads the downstream data. The data stream is encoded to identify to which subscriber a portion thereof is intended and that subscriber recognizes when it is the intended recipient of the data and extracts and processes it.

Transmission from the subscriber nodes back to the host (in the "uplink" direction) is done through the same optical splitter network and fiber, but on a second optical wavelength. The uplink bandwidth is shared between subscribers using time division multiplexing (TDM). Accordingly, the uplink data stream is necessarily bursty, as subscribers only transmit when they have data to send and at specific times to avoid collisions with other subscribers.

Because a single host optical transceiver is shared by many subscribers, PONs, including networks complying with the EPON (Ethernet PON) or GPON (Gigabit PON) standards are a relatively low cost solution while providing substantially higher data rates than the present state of the art for either wired or wireless access solutions.

In the more aggressive PON standard, GPON, maximum permissible data rates are 2.48832 Gbit/s in both the downstream and uplink directions, though in practice only 1.24416 Gbit/s is presently feasible for the uplink direction. Discussion is presently underway for future systems with 9.95328 Gbit/s and beyond.

Moreover, PON systems provide substantial economy over direct dedicated point to point solutions such as Ethernet or SONET. Accordingly, PONS are rapidly becoming the emerging access solution for the delivery of broadband services to the business and residential market.

Under the PON standard specifications, in the uplink direction, subscribers transmit their data in bursts at a frequency synchronized to the downstream data frequency. The subscribers recover the transmit clock signal from the downstream data and use this clock to retime their upstream data back to the host making the entire system frequency synchronous.

Even though all subscriber transmitters are synchronous with the host, they are all at different distances from the host and may also have different latencies before transmission occurs so the phase of the upstream data arriving at the host will vary widely from burst to burst.

Since the phase of every burst may be different, the phase of the host receiver sampling clock must be realigned with every burst of upstream data. Until the phase of the sampling clock has been successfully realigned to the data, any data received will be lost. To avoid loss of usable bandwidth it is preferable to minimize the portion of the burst that is lost during phase realignment.

Because of the bursty nature of upstream transmissions, conventional feedback mechanisms for clock recovery and resynchronization are not generally applicable as they typically take considerable time to approach the received frequency and then match its phase. Rather, any clock resynchronization mechanism must adapt to each burst in turn in a time much shorter than the burst duration.

In the various PON standards, each burst is preceded by a preambular period of short duration relative to the burst length in which a pattern providing expendible data transitions is transmitted for the purpose of allowing phase alignment of the receiver sampling clock to the burst. The use of a tone in particular ensures that there are a large number of rising and falling transitions to aid in the resynchronization process.

In GPON systems in particular, phase alignment should occur within the preambular period since a delimiter follows the preamble supplying framing information for the remainder of the burst. If the delimiter is incorrectly received, then the burst will be lost.

Conventional synchronizers for optical systems may require on the order of hundreds of microseconds to resynchronize to a data stream after a prolonged period without data applied to the input. However, the brevity of the preambular period mandates that resynchronization be completed in substantially less than 100 nanoseconds.

In current PON systems, digital oversampling techniques are applied to choose the optimal sampling point from among many samples per data bit period, using a digital state machine.

The granularity of sampling limits the accuracy of phase alignment. Improved granularity of sampling costs power and chip area and can be limited by matching concerns.

Accordingly, such prior art methodologies are only appropriate for relatively low uplink data rates, presently 1.24432 Gbit/s and below, but would not be feasible using currently available technology at rates of 2.48832 Gbit/s or above. Even at the preferred 1.24416 Gbit/s uplink data rate for GPON, the receiver performance would be limited by the oversample resolution.

This is because oversampling techniques suffer numerous limitations such as bandwidth, noise, and matching, all of which degrade the ability of the resynchronization circuit to synchronize at an optimal sampling position. This makes PON systems embodying such techniques very sensitive to signal degradation and may even result in loss of data when using longer fiber lengths.

Linear clock and data recovery (CDR) circuits, that is, a CDR circuit that continuously adjusts the phase of the recovered clock with infinite precision adapting to the centre of the data eye, have been conventionally used to adjust the frequency and phase of a local clock to optimally sample the data, using a feedback loop that compares the period of the received data to the period of a local clock and continuously adjusts the phase and period of the local clock to maintain a proper sample point even as the phase of the data changes. For the purposes of the discussion below, such maintaining of a proper sample point is referred to as frequency and/or phase locking to the local clock.

However, linear CDR circuits first match the frequency of the incoming data in an initial frequency lock state and it is only when frequency lock is achieved that the linear CDR circuits deal with the phase of the incoming data in a subsequent phase lock state. Unfortunately, typically, the length of the frequency lock state is, in such conventional systems, much longer than the time available for locking to a PON burst. Thus, such conventional systems are unsuited to burst mode applications.

Accordingly, it is desirable to provide a novel resynchronizer for resynchronizing the host receiver sampling clock in a PON system.

It is further desirable to provide a resynchronizing circuit that will automatically centre in the middle of the data eye without oversampling.

It is still further desirable to provide a resynchronizing circuit that is capable of operating at a present preferred 1.24416 Gbit/s uplink data rate and future 2.48832 Gbit/s rate as well higher rates that may be specified in the future.

SUMMARY OF THE INVENTION

The present invention accomplishes these aims by providing a modified linear CDR circuit to adjust the frequency and phase of a local clock oscillator to sample the data at an optimal point.

A feedback loop compares the data period to the period of the local clock oscillator and continually adjusts both the phase and the clock period to maintain a proper sampling point even as the phase of the data varies.

The inventive receiver circuit synchronizes to incoming burst data sufficiently quickly to comply with the highest data rate specified in the GPON standard while meeting the needs of anticipated future higher rates. The GPON standard presently provides the most stringent synchronization time requirements, namely 44 preamble bit periods at 1.24416 Gbit/s.

Advantageously, the inventive receiver circuit improves synchronized jitter performance over existing solutions so that additional timing margin is provided. Potentially, this could allow longer fiber lengths to be supported or the design of cheaper network elements in other parts of the system.

According to a first broad aspect of an embodiment of the present invention, there is disclosed a burst clock data recovery circuit in a host receiver in a bursty asynchronous communication system having a non-data preamble of less than 250 ns, for recovering a clock signal from a subscriber data burst, the circuit comprising:

(a) an adjustable oscillator for generating an output clock signal in response to a signal at an input thereof;

(b) a first comparator for comparing a frequency and phase of the output clock signal to that of a reference signal and feeding back a first feedback signal to the oscillator input; and (c) a second comparator for comparing the frequency and phase of the output clock signal to that of the data burst and feeding back a second feedback signal to the oscillator input once the output clock signal is locked in frequency with the reference signal;

whereby the output clock signal is locked in frequency and phase to the data burst before receipt of the last bit of the preamble.

According to a second broad aspect of an embodiment of the present invention, there is disclosed a method of recovering a clock signal from a subscriber data burst to a host receiver in a bursty asynchronous communication system having a non-data preamble of less than 250 ns before receipt of the last bit of the preamble, the method comprising the steps of:

(a) generating an output clock signal in response to an oscillator input;

(b) comparing the output clock signal against a reference signal substantially locked in frequency to that of the data burst;

(c) feeding back a first feedback signal to the oscillator input corresponding to a difference between a frequency and phase of the output clock signal and that of the reference signal until the output clock signal is substantially locked in frequency and phase to the reference signal;

(d) waiting for detection of the data burst;

(e) comparing the output clock signal to the data burst; and (f) feeding back a second feedback signal to the oscillator input corresponding to a difference between the frequency and phase of the output clock signal and that of the data burst until the output clock signal is substantially locked in frequency and phase to the data burst.

BRIEF DESCRIPTION OF THE DRAWINGS

The embodiments of the present invention will now be described by reference to the following figures, in which identical reference numerals in different figures indicate identical elements and in which.

DETAILED DESCRIPTION OF THE PREFERRED EMBODIMENTS

Figure 1:
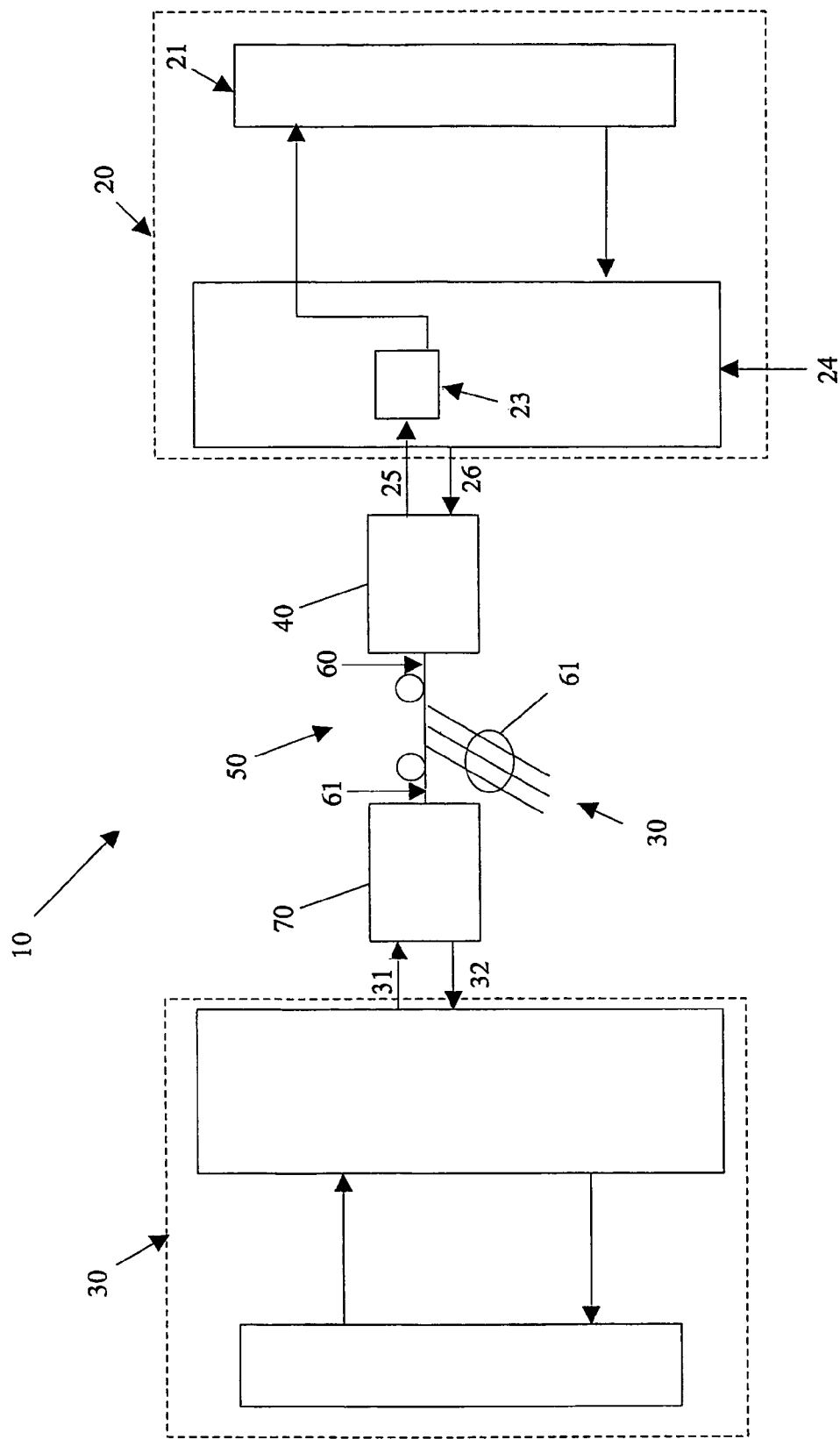
FIG. 1 is a system block diagram of a conventional PON system.

Referring now to FIG. 1, there is shown a system block diagram of a PON system 10 in which the present invention might find application.

The system 10 comprises a PON host 20, a plurality of substantially identical (for purposes of the present discussion) PON subscribers 30, of which an exemplary subscriber is shown in detail, a PON host optical module 40, at least one optical splitter 50, a plurality of fibers 60, 61 and a plurality of PON subscriber optical modules 70.

The host 20 is connected to the host optical module 40 by a pair of serial connections 25 and 26. Serial connection 26 conveys serial data from the host 20 to the host optical module 40 (downstream data) while serial connection 25 conveys serial data from the host optical module 40 to the host 20 (uplink data). As mandated by the PON standard specifications, the downstream data is transmitted in continuous fashion while the uplink data is received in bursts.

As shown in FIG. 1, the host 20 may accept data for transmission as downstream data from an external source (not shown) through a parallel data interface 21 and forward on the received uplink data to the external source through the parallel data interface 21.

The host 20 accepts as an input a global frequency reference 24, which it uses to time its downstream data.

As is discussed below, the host 20 also comprises a burst CDR circuit 23 in accordance with the present invention, with which the host 20 maintains a receiver sampling clock that is synchronized to each uplink data burst received along serial connection 22.

Each subscriber 30 is connected to a corresponding subscriber optical module 70 by a pair of serial connections 31 and 32. Serial connection 31 conveys serial data from the subscriber 30 to the subscriber optical module 70 (uplink data) while serial connection 32 conveys serial data from the subscriber optical module 70 to the subscriber 30 (downstream data). As mandated by the PON standard specifications, the downstream data is received in continuous fashion while the uplink data is transmitted in bursts.

The subscriber 30 recovers a clock signal from the downstream data and uses it to retime its uplink data intended for the host 20, thus ensuring relative identity of frequency for all uplink data intended for the host 20.

The host optical module 40 is connected to the host 20 by serial connections 25 and 26 and to a single optical fiber 60 feeding into the optical splitter 50. The host optical module 40 converts the downstream serial data received along serial connection 26 from the electrical domain into the optical domain and transmits it along host optical fiber 60 at a first downstream wavelength. Similarly, it converts the uplink optical data it receives along host optical fiber 60 at a second upstream wavelength back down to the electrical domain and transmits it in serial form along serial connection 25 to the host 20.

The optical splitter 50 is connected to the host optical module 40 by the host optical fiber 60 and to a plurality of subscriber optical fibers 61 each feeding into a corresponding subscriber optical module 70. The optical splitter 50 divides downstream signals arriving along the host optical fiber 60 at the downstream wavelength to each of the subscriber optical fibers 61 and collects uplink signals arriving along the various subscriber fibers 61 at the uplink wavelength and merges them into the host fiber 60.

Those having ordinary skill in the art will readily recognize that depending upon the number of subscribers in the PON, a plurality of optical splitters, either in parallel or cascaded may be implemented to accommodate the subscribers, with additional fibers (not shown) interconnecting them.

Figure 2:
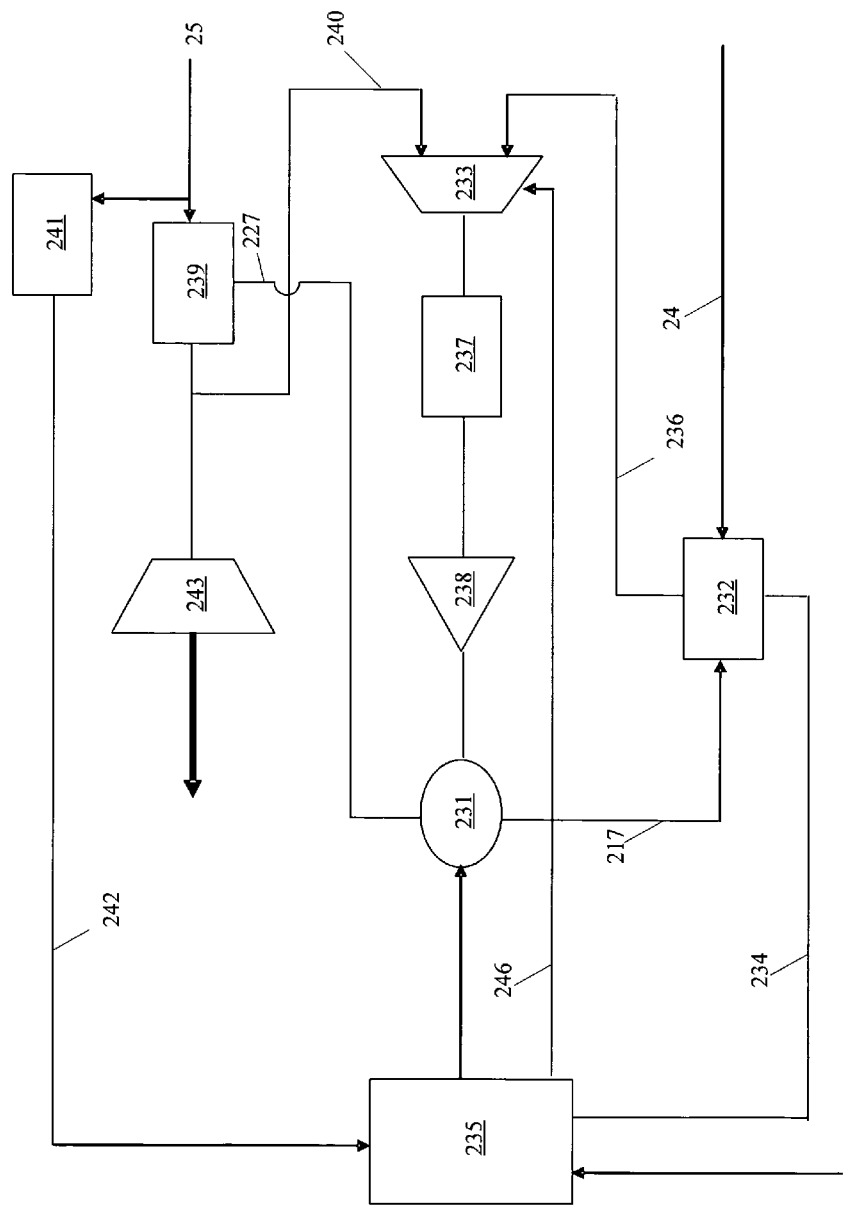
FIG. 2 is a system block diagram of a linear burst mode receiver according to the present invention for use in the PON Host Transceiver shown in FIG. 1.

Turning now to FIG. 2, the structure of the inventive burst CDR 23 is shown in detail. The CDR 23 comprises a modified linear CDR circuit constructed from known silicon technology components, although in an innovative combination.

It comprises a voltage controlled oscillator (VCO) 231, which is preferably but not limited to an inductive/capacitive (LC) VCO, acting as a variable phase/frequency clock source. The VCO 231 is adjustable in frequency as a function of either input voltage or input current. Those having ordinary skill in this art will readily recognize that the LC VCO is an oscillation source with variable phase/frequency. Alternatively fixed phase VCO sources followed by phase rotators to provide phase interpolation could be used. Those having ordinary skill in this art will readily recognize that a ring oscillator with calibrated parameters related to PLL bandwidth could also be used.

At all times, the oscillator used in the inventive burst CDR circuit 23 to generate the receiver frequency is highly bandwidth constrained. Preferably, this is achieved by use of an LC VCO, which is chosen for its tight control of bandwidth-related parameters in conventional silicon processes. Those having ordinary skill in this art will readily recognize that any controllable oscillator with tight control of bandwidth related parameters could be suitably used.

Those having ordinary skill in this art will also recognize that conventional PON receivers using an oversampled synchronization scheme do not face such bandwidth constraints, so that ring oscillators are more typically used. Ring oscillators are well understood, low cost and of simple implementation. While they also produce much wider bandwidth variation, this is not significant in conventional oversampled synchronization approaches.

The inventive burst CDR circuit 23 modifies a conventional linear CDR circuit to overcome the timing constraints endemic to such circuits. Specifically, before a burst of uplink data arrives, the inventive linear CDR circuit 23 is synchronized to the same local frequency reference source 24 that times the downstream data stream, so that all of the subscribers 30 are already synchronized to this frequency and the time to achieve frequency synchronization is minimized.

In order to frequency lock the VCO to the master frequency reference, a frequency comparison circuit 232 compares the output 217 of the VCO 231 with the PON master frequency reference 24. The master frequency reference 24 is the same local frequency reference source that times the downstream data stream, so that all of the subscribers 30 are already synchronized to this frequency. Accordingly, the time to achieve frequency synchronization can be minimized. Typically, since the master frequency reference 24 operates at a lower frequency than the LC VCO 231, a divided version of the LC VCO 231 is actually compared against the master frequency reference 24.

Those having ordinary skill in this art will recognize that either the local sample clock, the reference, or both signals may be divided prior to the frequency/phase comparison. Accordingly, for the purposes of this invention, the term "frequency and/or phase lock" incorporate comparing a divided first signal with a higher rate second signal. In such circumstances, frequency and/or phase lock is said to have occurred when a pair of similar transitions occur at the same time (or within a predetermined tolerance) in both signals, even though in the higher rate signal the transitions are not necessarily consecutive.

The frequency comparison circuit 232 provides a correaction signal 236 to be used in a feedback loop to adjust the sample clock frequency during an initial lock to reference state. In the lock to reference state, the correaction signal 236 is fed through a PLL selector 233 and into a charge pump 237 that drives an integrating filter circuit 238 that feeds back into an input of the LC VCO 231. The integrating filter circuit 238 provides noise immunity and stability for the feedback loop. In the lock to reference state the local sample clock is locked in both frequency and phase to the master reference.

Preferably, the frequency comparison circuit 232 comprises a phase-frequency detector that locks the output signal 217 of the LC VCO 231 to the PON master frequency reference 24. Those having ordinary skill in the relevant art will recognize that such a phase-frequency detector will not lock the LC VCO 231 to data, but only to a tone, such as the master frequency reference 24.

The frequency comparison circuit 232 causes the LC VCO 231 to remain locked to the master reference frequency 24 between uplink bursts. When an uplink data burst arrives, a PLL selection switch 233 causes the burst CDR circuit 23 to switch to a lock to data state in which the correaction signal for a feedback phase locked loop (PLL) comprising the VCO 231, integrating filter circuit 238 and charge pump 237 is derived from the data, not the master reference frequency 24.

Preferably the arrival of the uplink data burst is detected and signalled by a data detection circuit 241 that monitors the uplink data stream from serial connection 25. Alternatively, the host 20 may provide an external signal (not shown) when it obtains information about the anticipated arrival time of the burst. Still further, a signal may be obtained from the optics (not shown) to initiate phase lock.

The data detection circuit 241, or an external signal indicating the presence of a data burst, transmits a signal 242 to a system controller 235 when data is received along the serial connection 25, so that the LC VCO 231 should be locked to data as opposed to the master reference source 24.

The system controller 235 is preferably a state machine consisting of a plurality of timers (not shown). In order to optimize phase lock to the data burst, the receiver remains in the lock to data state only when uncorrupted data is present. The timers ensure that this is the case.

A first timer provides a delay before initiating data lock after data has been signalled to be present by either the data detection circuit 241 or an external signal. This first delay provides a settling period for the data (not shown) after laser turn on at the subscriber 30. During this delay period, the VCO 231 remains locked to the master reference 24. If phase lock to data is attempted before the data has settled, the burst CDR 23 could be driven out of frequency lock before uncorrupted data arrives. In such an event, the long time period to reacquire frequency lock would result in the loss of the data in the data burst.

Prior to arrival of the burst, the inventive CDR 23 is placed in a high bandwidth state. This state speeds phase lock during the preambular period. The initiation of the higher bandwidth state is achieved by supplying control signals to both the charge pump 237 and the integrating filter circuit 238, thus increasing the gain of each while still meeting PLL requirements for stability and linearity. The bandwidth setting for the lock to data state is beyond the range usually associated with broadband standards.

The time with expanded bandwidth is limited by a second timer in the system controller 235 to limit jitter effects caused by the expanded bandwidth. A high bandwidth CDR will be subject to high pattern-dependent recovered clock jitter when recovering a clock from random data. If a tone is used for the preamble, this higher pattern-dependent jitter is not present. For this reason the inventive burst receiver 23 is only placed in its high bandwidth state when bursts are not present or during a tonal preamble. Following the timeout of the second timer (set to expire prior to the arrival of payload data) the CDR will be forced to a low bandwidth state. Again, this bandwidth optimization is accomplished using control signals to the charge pump 237 and the integrating filter circuit 238.

Eventually, once the uplink data burst has been determined to have ended, the inventive burst CDR 23 will be returned to a high bandwidth state. The end of the burst is determined by the system state machine detecting that a sufficient number of 0s have occurred to guarantee that the subscriber laser is off and that the pattern is not simply a valid occurrence of a long string of 0s within the burst. This is implemented with a third timer in the state machine. An external control signal from the host can also be used to signal the end of the burst. When data has been determined to be no longer present, the VCO 231 is locked to the master reference 24 in preparation for the next burst.

If frequency lock is lost, as a result of drift in the absence of data it will take a considerable period of time to reacquire lock. It is for this reason, after the burst is complete, that the system controller 235 causes the burst CDR 23 to lock to the master reference frequency 24 so that the absence of data will not cause frequency lock to be lost.

Those having ordinary skill in this art will also readily recognize that a collision of two bursts may also cause the linear CDR to lose frequency lock. For example, if during normal operation a subscriber sends data during an invalid timing window (for that subscriber) or during ranging mode when multiple subscribers simultaneously send bursts to allow system calibration, a conventional CDR will lose frequency lock. To regain frequency lock, the system will either have to wait for CDR recovery or the host must recognize the delivery of corrupt data and immediately force the CDR to lock to the master reference. As collision events are rare, a CDR recovery period is allowable within the standard.

When the CDR is in the lock to data state, the phase comparison circuit 239 compares the output signal 227 of the LC VCO 231 to the received data stream delivered from serial connection 25 and generates an output voltage or current 240 that is a linear function of the phase difference between a transition in the uplink data stream and a transition in the output signal 227 of the LC VCO 231. The output signal 240 is fed into the PLL selection switch 233 and in the lock to data state, through the charge pump 237 and the integrating filter circuit 238 and back into the LC VCO 231. Thus, the feedback circuit fixes the LC VCO 231 in a stable state at an optimal phase that corresponds with the center of the data eye. Those having ordinary skill in this art will recognize that the center of the eye depends on the shape of the eye. The phase of the CDR may be adjusted slightly to optimize the bit error rate of the system and the center of the eye should be understood as that phase that is most optimal for transmission of data. A CDR may also be centered slightly off center and still provide sufficient performance for some systems.

Preferably, the phase comparison circuit 239 comprises a modified Hogge-type phase detector circuit. The Hogge-type circuit works in conjunction with the charge pump 237 to drive a linear current output as an input into the integrating filter circuit 238 and ultimately providing a correction signal to the LC VCO 231. Alternatively, those having ordinary skill in this art will readily recognize that many other types of linear and non-linear phase detectors could be used, including but not limited to a bang-bang phase detector, SAW filter, mixer, and sample&hold phase detector.

Finally, a demultiplexing circuit 243 converts the recovered high speed serial data stream from the phase comparison circuit 239 at a data rate suitable for conventional digital processing by the host 20.

In operation, at all times the system controller 235 monitors the frequency of the VCO 231 and compares it to that of the master reference 24 or divided versions thereof. This is done by counting transitions of the divided VCO clock and the master reference within a fixed time duration. The difference between counts translates to the frequency deviation between the two clocks. If the count period is long enough to provide sufficient resolution and the counts differ beyond a threshold that defines frequency lock (~1 loop bandwidth) then the burst CDR 23 will be forced into frequency lock with the master reference 24 to resynchronize the VCO with the PON master reference frequency. This monitor function overrides all other system controller 235 functions because no other states are valid if there is excessive frequency deviation between the frequency of the master reference 24 and the frequency of the VCO 231.

The frequency monitoring time to provide a resolution of 1 loop bandwidth is substantially longer than the time to achieve frequency lock. Transition from the lock to reference state to the lock to data state can only occur after the frequency comparison circuit 232 has completed a measurement. In order to speed frequency lock after a collision (or other event forcing loss of frequency lock), the frequency comparison circuit 232 resolution is relaxed below the traditional value for transport systems of 1 loop bandwidth. The monitor measures gross loss of frequency lock but has its resolution set low enough so that it does not gate the readiness of the CDR for the next burst. The time for frequency lock is known and the monitor resolution is set so that frequency lock will be guaranteed in the time that is takes to monitor the frequency.

Following the transition to the lock to reference state, the system controller 235 forces the inventive burst CDR receiver 23 to remain in the lock to reference state until the VCO 231 frequency matches that of the master frequency reference 24. While in the lock to reference state, the LC VCO 231 will be in its high bandwidth setting so as to promote fast frequency locking.

Once frequency lock has been acquired, and when data is thereafter detected by the data detection circuit 241, the system controller 235 will delay for a pre-determined delay to ensure that the data has settled. Thereafter, the system controller 235 will signal the PLL selection switch 233 using timer signal 246 to lock to data in an attempt to acquire phase lock.

Thereafter, after a further pre-determined delay, the bandwidth of the CDR will be lowered for optimal circuit jitter performance. This second delay is chosen to ensure that sufficient phase lock has occurred.

Presence of data is determined by the presence of optical output at the receiver of the host 20 when the subscriber optical module laser (not shown) is activated and transmitting a minimum number of 1s in a given time period. The minimum number is determined from analysis of typical data, which is permitted to have a limited sequence of consecutive 0s under the transmission protocol. The PON standards statistically permit up to 72 consecutive 0s in real data, however those persons having ordinary skill in the art will readily recognize that 72 is just an example. Accordingly, if the system controller 235 times out because of an excessive number of 0s in the pattern, for example, after a period corresponding to 72 consecutive 0s, it will conclude that data has been lost and revert to the lock to reference state.

It is possible to have a time between bursts of less than 72 bits. If this is true then the burst CDR 23 relies on external input from the host to determine the expected beginning and end of a burst. In order for the PON to function without collisions, the latency between the host and each subscriber must be calibrated in a ranging/discovery period within the PON protocol. During this ranging period the host compiles the timing data that is necessary to supply an external host signal to the burst receiver indicating a gap between burst. This signal allows the use of the timers in the system controller 235 to optimize bandwidth, expanding it for phase acquisition, and after phase lock, contracting it for jitter immunity. If an external signal is not available then the burst CDR 23 will be subject to effects including lack of filtering at laser turn on and the inability to have a different bandwidth during the preamble and the payload data. The burst receiver 23 can still function with these restrictions but performance will be sub-optimal.

Because the inventive burst CDR 23 does not employ oversampling, it is better suited to enable host receiver synchronization at higher PON data rates, for example, at 1.24416 Gbit/s and higher. Indeed, as data rates increase, synchronization times improve because there are more data transitions available to more rapidly force phase lock. Also there is a fundamental stability ratio relation for a linear CDR between the CDR clock rate and the CDR bandwidth. Higher clock rates allow higher bandwidth and therefore faster locking time. By contrast, conventional oversampling systems are constrained to relatively lower data rates because sampling must take place at a significant multiple of the data rate. In today's 0.13 µm silicon technology, 10 Gbit/s conventional (non burst) linear receivers are widely available. The same technology has only delivered 1.25 Gbit/s oversampled receivers with sufficient resolution to be used in the longer reach optical links required in PON standards such as GPON. Baud rate sampling will always allow a higher maximum receiver rate within a given technology as compared to oversampling.

Simulations have predicted that the inventive burst CDR 23 will achieve frequency lock to the master reference within 12 µs and will typically achieve phase lock to data within 10 ns. In particular without bandwidth widening during the preambular period, the inventive burst CDR 23 will achieve lock in less than 250 ns at data rates below 1.2 Gb/s. Above this data rate, other components in the system overwhelm the ratio between the preambular time and the bit period, so that the standards will fix the phase lock period to less than 250 ns. This provides significant margin in the GPON timing budget that may now be used by other components in the system and compares favourably to the lock time period of approximately 15,000 bit periods using a conventional (CDR or oversampling) system.

When the inventive CDR 23 has a variable bandwidth that may be increased as previously discussed during the preambular period, the inventive burst CDR 23 will require a maximum of 30 bits to achieve lock.

The inventive burst mode receiver 23 is constructed in conventional and economic CMOS processes and it allows other elements in the systems to be designed with relaxed specifications thus providing multiple cost advantages.

The present invention can be implemented in digital electronic circuitry, or in computer hardware, firmware, software, or in combination thereof. Apparatus of the invention can be implemented in a computer program product tangibly embodied in a machine-readable storage device for execution by a programmable processor; and methods actions can be performed by a programmable processor executing a program of instructions to perform functions of the invention by operating on input data and generating output. The invention can be implemented advantageously in one or more computer programs that are executable on a programmable system including at least one input device, and at least one output device. Each computer program can be implemented in a high-level procedural or object oriented programming language, or in assembly or machine language if desired; and in any case, the language can be a compiled or interpreted language.

Suitable processors include, by way of example, both general and specific microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in ASICs (application-specific integrated circuits).

The system may comprise a processor, a random access memory, a hard drive controller, and an input/output controller coupled by a processor bus.

It will be apparent to those skilled in this art that various modifications and variations may be made to the embodiments disclosed herein, consistent with the present invention, without departing from the spirit and scope of the present invention.

Other embodiments consistent with the present invention will become apparent from consideration of the specification and the practice of the invention disclosed therein.

Accordingly, the specification and the embodiments are to be considered exemplary only, with a true scope and spirit of the invention being disclosed by the following claims.

We claim:

1. A burst clock data recovery circuit in a host receiver in a bursty asynchronous communication system, for recovering a clock signal from a subscriber data burst having a non-data preamble of less than 250 ns, the circuit having an adjustable bandwidth and comprising:
   (a) an adjustable oscillator for generating an output clock signal in response to a signal at an input thereof;
   (b) a first comparator for comparing a frequency and phase of the output clock signal to that of a reference signal and feeding back a first feedback signal to the oscillator input corresponding to a difference between the frequency and phase of the output clock signal and that of the data burst until the output clock signal is substantially locked in frequency and phase to the reference signal;
   (c) a second comparator for comparing the frequency and phase of the output clock signal to that of the data burst and feeding back a second feedback signal to the oscillator input corresponding to a difference between the frequency and phase of the output clock signal and that of the data burst until the output clock signal is substantially locked in frequency and phase to the data burst;
   (d) a system controller constructed and arranged to selectively widen and narrow the bandwidth of the circuit and to generate a selector signal; and
   (e) a selector constructed and arranged to switch the signal provided to the oscillator input between the first and second feedback signals in response to the selector signal data signal;
   wherein
   the system controller widens the bandwidth of the circuit in response to a data detected signal and generates the selector signal in response to the data detected signal;
   the adjustable oscillator generates the output clock signal that is substantially locked in the frequency and phase to that of the data signal; and
   the system controller narrows the bandwidth of circuit before receipt of a last bit of the preamble.

2. The burst clock data recovery circuit according to claim 1, wherein the reference signal is substantially equal in frequency to that of the data burst.

3. The burst clock data recovery circuit according to claim 1, wherein the output clock signal is a divided version of the oscillator output and the reference signal is substantially equal to a divided version of the data burst frequency.

4. The burst clock data recovery circuit according to claim 1, wherein the oscillator is a voltage controlled oscillator (VCO).

5. The burst clock data recovery circuit according to claim 4, wherein the oscillator is an inductive/capacitive (LC) VCO.

6. The burst clock data recovery circuit according to claim 4, wherein the oscillator comprises a phase rotator to provide phase interpolation.

7. The burst clock data recovery circuit according to claim 4, wherein the oscillator comprises a ring oscillator.

8. The burst clock data recovery circuit according to claim 1, wherein the first comparator comprises a phase-frequency detector.

9. The burst clock data recovery circuit according to claim 1, wherein the first feedback signal is fed back to the oscillator input through an integrating filter.

10. The burst clock data recovery circuit according to claim 1, wherein the first feedback signal is fed back to the oscillator input through a charge pump.

11. The burst clock data recovery circuit according to claim 1, wherein the reference signal is provided to the subscriber by one member selected from the group consisting of a master PON reference clock and a reference clock having a frequency substantially equal to a frequency of the data burst.

12. The burst clock data recovery circuit according to claim 1, wherein the second comparator is selected from the group consisting of a Hogge-type phase detector, a Bang Bang, a mixer, a saw filter, and a sample and hold circuit.

13. The burst clock data recovery circuit according to claim 1, wherein the second feedback signal is fed back to the oscillator input through a charge pump.

14. The burst clock data recovery circuit according to claim 1, wherein the second feedback signal is fed back to the oscillator input through an integrating filter.

15. The burst clock data recovery circuit according to claim 1, wherein the system controller comprises a state machine.

16. The burst clock data recovery circuit according to claim 1, further comprising a data detector for determining the commencement of the data burst.

17. The burst clock data recovery circuit according to claim 1, wherein the data detected signal is a signal from a source which indicates arrival of the data burst.

18. The burst clock data recovery circuit according to claim 7, wherein the absence of data signal is provided to the system controller by an external source.

19. The burst clock data recovery circuit according to claim 1, wherein the system controller comprises a laser on timer for generating a delay between receipt of the data detected signal and the generation of the lock to data signal.

20. The burst clock data recovery circuit according to claim 1, wherein the system controller comprises a low bandwidth timer for generating a delay between the lock to data signal and notification of a low bandwidth mode.

21. The burst clock data recovery circuit according to claim 20, wherein the system controller is constructed and arranged to narrow the bandwidth of the circuit upon entering the low bandwidth mode.

22. The burst clock data recovery circuit according to claim 1, wherein the system controller further comprises a counter for determining absence of data in the receiver.

23. The burst clock data recovery circuit according to claim 22, wherein the system controller is constructed and arranged to monitor the output clock signal for a deviation from the reference signal frequency and to generate a monitor signal locking the receiver to the master reference if the deviation is larger than a predetermined amount.

24. The burst clock data recovery circuit according to claim 1, wherein the system controller is constructed and arranged to widen the bandwidth of the circuit upon detecting absence of data in the receiver.

25. The burst clock data recovery circuit according to claim 24, wherein the data burst arrives at a bit rate of 1.2 Gb/s or less and the adjustable oscillator generates the output clock signal that is substantially locked in the frequency and phase to that of the data signal before receipt of approximately the $50^{th}$ bit of the preamble.

26. The burst clock data recovery circuit according to claim 25, wherein the system controller is constructed and arranged to generate a lock to reference signal and to to supply the lock to reference signal to the selector in the absence of data.

27. The burst clock data recovery circuit according to claim 26, wherein the selector is constructed and arranged to switch from providing the second feedback signal to the oscillator input to providing the first feedback signal to the oscillator input in response to the lock to reference signal.

28. The burst clock data recovery circuit according to claim 24, wherein the data burst arrives at a bit rate of 1.2 Gb/s or more and the adjustable oscillator generates the output clock signal that is substantially locked in the frequency and phase to that of the data signal before approximately 40 ns after receipt of the first bit of the preamble.

29. A method of recovering a clock signal from a subscriber data burst to a host receiver in a bursty asynchronous communication system, the data burst having a non-data preamble of less than 250 ns, the method using a clock data recovery circuit (CDR) having an adjustable bandwidth and comprising the steps of:
(a) generating an output clock signal in response to an oscillator input;
(b) comparing the output clock signal against a reference signal substantially locked in frequency to that of the data burst;
(c) feeding back a first feedback signal to the oscillator input corresponding to a difference between a frequency and phase of the output clock signal and that of the reference signal until the output clock signal is substantially locked in frequency and phase to the reference signal;
(d) waiting for detection of the data burst;
(e) widening the bandwidth of the CDR in response to the detection of the data burst;
(f) comparing the output clock signal to the data burst;
(g) feeding back a second feedback signal to the oscillator input corresponding to a difference between the frequency and phase of the output clock signal and that of the data burst until the output clock signal is substantially locked in frequency and phase to the data burst; and
(h) narrowing the bandwidth of the CDR before receipt of a last bit of the preamble.

30. The method according to claim 29, wherein the output clock signal is a divided version of an oscillator output in generated in response to the oscillator input and the reference signal is substantially equal to a divided version of the data burst frequency.

31. The method according to claim 29, wherein step (b) comprises providing the first feedback signal to a frequency input of a PLL selector and generating a lock to reference signal to the PLL selector to connect the frequency input to the oscillator input.

32. The method according to claim 29, wherein step (f) comprises providing the second feedback signal to a phase input of a PLL selector and generating a lock to data signal to the PLL selector to connect the phase input to the oscillator input.

33. The method according to claim 32, further comprising, before the step of generating a lock to data signal, waiting a data settling period after detection of the data burst.

34. The method according to claim 29, wherein step (a) comprises widening the bandwidth of the circuit after determining absence of data.

35. The method according to claim 34, further comprising, before narrowing the bandwidth of the circuit, determining the circuit has locked to the preamble of the data burst.

36. The method according to claim 29, wherein step (a) comprises narrowing a bandwidth of the circuit after receiving notification of a low bandwidth mode.

37. A method of recovering a clock signal from subscriber data bursts received by a host receiver in a bursty asynchronous communication system using a clock data recovery circuit (CDR) having an adjustable bandwidth, each data burst having a frequency, a phase, and a non-data preamble of less than 250 ns, the method comprising the steps of:
(a) locking a frequency of the CDR to a reference signal;
(b) widening the bandwidth of the CDR in response to a data burst detection signal;
(c) locking the frequency and a phase of CDR to the frequency and phase of the data burst during the preamble of the data burst;
(d) narrowing the bandwidth of the CDR before receipt of a last bit of the preamble.

38. The method according to claim 37, further comprising after step (b) the step of:
(b1) waiting a data settling period after detection of the data burst.

39. The method according to claim 37, wherein the reference signal is a master system clock of the asynchronous communication system.

40. The method according to claim 37, wherein step (b) comprises:
(b1) determining if a data burst has been received by the host receiver;
(b2) widening the bandwidth of the CDR if no data burst has been received; and
(b3) waiting a preselected time period if a data burst has been received by the host receiver.

41. The method according to claim 40, further comprising after step (c) the step of
(c1) narrowing the bandwidth of the CDR after the preselected time period.

* * * * *